Figure 1:
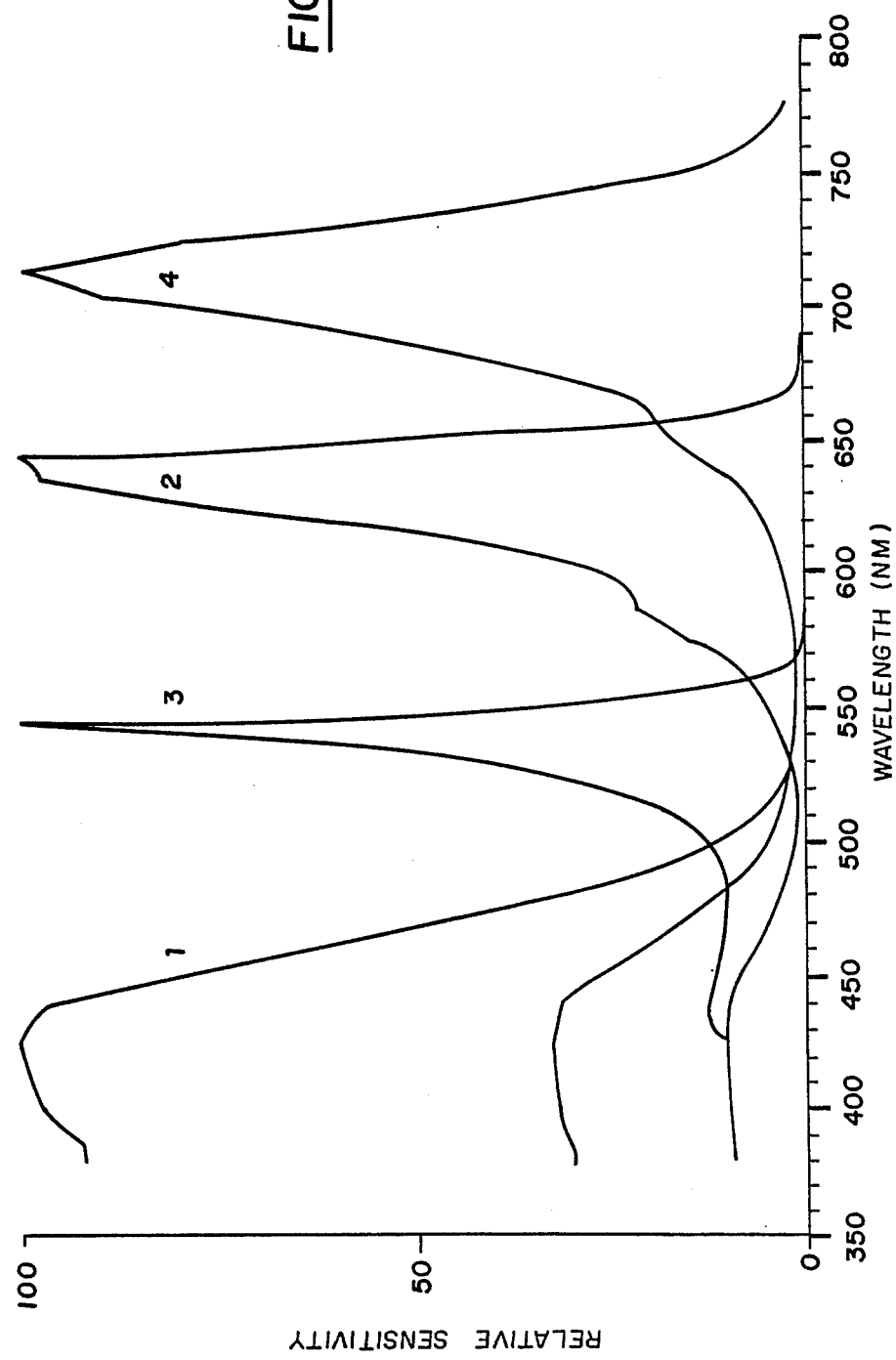

United States Patent [19]

Powers et al.

[11] Patent Number: 4,943,517
[45] Date of Patent: Jul. 24, 1990

[54] IMAGING SYSTEM

[75] Inventors: Stephen R. Powers; Peter J. Finn, both of Harlow; Michael G. Fisher, Epping, all of England

[73] Assignee: Minnesota Mining and Manufacturing Company, St. Paul, Minn.

[21] Appl. No.: 251,342

[22] Filed: Sep. 30, 1988

Related U.S. Application Data

[62] Division of Ser. No. 37,953, Apr. 13, 1987.

[30] Foreign Application Priority Data

Apr. 15, 1986 [GB] United Kingdom ............... 8609137

[51] Int. Cl.$^5$ .................... G03C 5/08; G03C 5/16
[52] U.S. Cl. .................... 430/301; 430/356; 430/358; 430/363; 430/945; 430/944
[58] Field of Search ............ 430/301, 358, 363, 945, 430/944, 356

[56] References Cited

U.S. PATENT DOCUMENTS

| | | | |
|---|---|---|---|
| 2,508,213 | 5/1950 | Ball | 95/2 |
| 3,144,333 | 8/1964 | Waldherr | 96/32 |
| 3,291,603 | 12/1966 | Bryan | 96/20 |
| 3,772,015 | 11/1973 | Kirsch | 96/30 |
| 4,321,321 | 3/1982 | Moore | 430/356 |
| 4,416,522 | 11/1983 | Webster | 354/4 |
| 4,619,892 | 10/1986 | Simpson et al. | 430/505 |
| 4,705,745 | 11/1987 | Kitchin et al. | 430/505 |

*Primary Examiner*—Paul R. Michl
*Assistant Examiner*—Mark R. Buscher
*Attorney, Agent, or Firm*—Donald M. Sell; Walter N. Kirn; Mark A. Litman

[57] ABSTRACT

An imaging process which comprises the steps of:
(i) providing a first radiation sensitive element comprising a transparent base having coated thereon at least three imaging media each capable of forming a color image upon imagewise exposure and processing, each of said imaging media capable of forming a color image having a maximum sensitivity at a wavelength different from the wavelengths of the maximum sensitivity of the other imaging media capable of forming a color image and the wavelength of the maximum absorption of the color image formed by each imaging medium differing from the wavelength of the maximum absorption of the color image formed by the other imaging media by at least 40 nm;
(ii) obtaining color separation information representative of the cyan, magenta and yellow and optionally black content of a color original, or electronically generated image,
(iii) exposing said first radiation sensitive element of step (i) to at least three independently modulated sources of radiation, each source being modulated by said color separation information with respect to one color and emitting radiation at a wavelength in the region of the wavelength of maximum sensitivity of one of said imaging media capable of forming a color image such that a latent image representative of at least the cyan, magenta and yellow information of step (ii) is formed in individual color forming media;
(iv) processing said exposed radiation sensitive element to produce a transparency comprising at least three color images, a first color image being representative of the color separation information for cyan, a second color image being representative of the color separation information for magenta and a third color image being representative of the color separation information for yellow,
(v) exposing a second radiation sensitive element comprising a base having at least one imaging medium coated thereon through said transparency produced in step (iv) to record on said second radiation sensitive element an image corresponding to one or more of the images of said imaging media of the transparency.

11 Claims, 5 Drawing Sheets

IMAGING SYSTEM

This is a division of application Ser. No. 37,953, filed Apr. 13, 1987.

FIELD OF INVENTION

This invention relates to an imaging system useful for colour printing. In particular the invention relates to an imaging system in which an intermediate transparency is produced by exposure to three or four independently modulated sources, and a final hard copy, which may be in the form of a colour proof, a colour print, a black and white colour separation, a colour separated printing plate etc., is imaged by exposure through the intermediate transparency.

BACKGROUND TO THE INVENTION

The process of colour printing by photolithography involves the separation of the colours of the image into a number of components (usually four) to be reproduced by printing inks of corresponding colour (usually yellow magenta, cyan and black).

Each colour separation is converted into the form of a halftone dot pattern by which tone rendition is achieved in lithographic printing. The perceived density of a particular colour on the final print depends on the relative size of the halftone dots in that area. It has recently become the practice to carry out both the colour separation and the generation of halftone dots automatically using a colour separation scanner of the electronic dot generation (EDG) type. The four halftone separation images are processed electronically and separately placed onto black and white silver halide films using a scanned laser device. The printing plates are prepared from these four silver images or their duplicates by contact exposure. A further development in this area is the increasing use of electronic pagination systems which can manipulate the digitally stored image data for the purpose of page composition.

A very desirable adjunct to the electronic scanner and pagination systems is a method of producing a colour proof directly from the electronically stored data without the requirement for intermediate black and white images on silver halide film.

Several methods for the production of colour proofs directly from electronically stored images are known. It is possible to represent the image on a colour cathode ray tube which may be photographed using any of the commercially available colour photographic materials. Alternatively, a black and white cathode ray tube may be photographed sequentially through different spectral filters. A more sophisticated device which has become available enables the image to be scanned in continuous tone form onto conventional photographic colour paper using blue, green and red light from argon-ion and helium-neon lasers. An additional method is to use the signals to a colour TV monitor to drive a continuous tone scanning device which uses a white light source through red, green and blue filters, to expose a diffusion transfer material.

There are fundamental limitations to the usefulness of the known direct colour proofing methods. In particular, it is not possible to record the image in the exact form that it will finally appear, that is, as superimposed yellow, magenta, cyan and black images of halftone structure.

In one respect this limitation is imposed by the selection of photographic colour materials which are available. All of the silver halide colour recording materials presently available which work by the subtractive principle produce images which are formed from dyes of only three colours: yellow, magenta and cyan.

It is recognised in the printing industry that a colour proof should be an exact representation of the final printed image produced from four superimposed halftone images in yellow, cyan, magenta and black inks. This is not readily feasible using a colour material which cannot form a black image independent of the other colours. To produce a proof using known colour photographic materials the yellow, magenta and cyan images have to be modified to compensate for the absence of a black layer The result is, therefore, one stage removed from a genuine proof.

A further drawback of known methods employing conventional colour photographic materials is the limitation that the final images are of the continuous tone type rather than the halftone form of the final printed image. Since one of the principal reasons for making a proof is to check whether the sizes of the yellow, magenta, cyan and black halftone dots are correct to produce the desired hue and tone the proof should be composed of halftone dots rather than continuously varying density calculated to produce the same visual effect. The current use of continuous tone exposures is probably dictated by the resolution of the imaging devices in use, the extra equipment cost for computing equivalent yellow, magenta and cyan halftones to the yellow, magenta, cyan and black halftones, the low to medium contrast of commercially available photographic colour materials which makes them not ideal for halftone exposures, and the limited resolution of conventional chromogenic colour paper.

For these reasons the direct colour proofing methods presently available have not achieved widespread acceptance except as a check on page layout and composition. It is still common practice to produce high quality colour proofs either by actually printing on a special press or by laminating together individual yellow, magenta, cyan and black images formed in various ways by contact exposure through halftone separations on black and white film. These methods are generally time consuming and often require a high level of skill on the part of the operator Our copending British Patent Application No. GB 2172118A discloses a radiation-sensitive element suitable for colour proofing comprising a substrate bearing at least four separate imaging media coated thereon, said imaging media including:

(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing, and
(4) an imaging medium capable of forming a black or a balancing black image upon imagewise exposure and processing, each imaging medium having a maximum spectral sensitivity at a wavelength different from that of the maximum sensitivity of the other imaging media.

The four layer elements are particularly suitable for the generation of highly accurate half-tone colour proofs. The element is exposed by the four independent sources of different wavelengths and image formation in each layer is attributable only to a single source. Thus each layer may be truly representative of the printing plate used to apply the corresponding ink in the printing process.

The elements are based on an entirely different principle to conventional colour photographic silver halide elements. Conventional elements produce a colour image by combinations of cyan, magenta and yellow dyes and the exposing radiation causes image formation with a dye including the wavelength of the exposing source within its principal absorption band. Thus a black image is formed by a combination of all three dyes generated by exposure of different wavelengths and there is no provision for generating black or balancing black by exposure to a single wavelength. The four layer elements utilize false-colour address in order to separate magenta, cyan, yellow and black. Thus the wavelength of the exposing source used to indicate a particular photosensitive layer is entirely independent of the colour generated in that layer. For example, a magenta separation may be digitised and thereafter cause an infra-red sensitive source to expose an imaging layer sensitive to infra-red. This material, on processing, generates a magenta image Hitherto false-colour address has been used only for specialised image recording, e.g. infra-red aerial photography and X-ray photography with the exception of U.S. Pat. No. 4,619,892. That patent discloses full colour photographic images are produced by exposure of a radiation-sensitive element comprising at least three silver halide emulsion layers. At least two of which silver halide emulsion layers are sensitised to infrared radiation. Selectively absorptive filter layers and/or differential senstivities between emulsion layers are used to prevent exposure of other layers to radiation used to expose a single layer.

The imaging media of the elements are selected such that not only does each medium have a maximum spectral sensitivity at a wavelength which is different from the wavelengths of maximum spectral sensitivity of the other imaging media but each imaging medium has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium. Thus, upon irradiation by four independent sources having wavelengths corresponding to the maximum spectral sensitivity of the layers and subsequent processing, the elements of the invention form super-imposed yellow, magenta, cyan and black or balancing black images, each image being attributable to the image-wise exposure of the respective source.

The elements can be utilised as a colour proofing system which can produce four-colour, halftone proofs of high accuracy directly from electronically processed separation image data. The digitally processed images are used to modulate independent sources of actinic radiation, e.g. light emitting diodes (LED), laser diodes or infrared emitting diodes (IRED), which are selected to emit at the wavelength of maximum spectral sensitivity of the medium corresponding to the digitally processed image. The four independent exposures may be conducted simultaneously or sequentially since the spectral sensitivities of the imaging media are selected such that exposure from one source will cause imaging formation in one imaging medium but not significantly affect the other imaging media.

British Patent Application No. GB 2172118A also discloses a process for producing a coloured half-tone image comprising providing a light sensitive element comprising a substrate bearing three separate imaging media coated thereon, said imaging media consisting of:
 (1) an imaging medium capable of forming a yellow image upon imagewise exposure and processing,
 (2) an imaging medium capable of forming a magenta image upon imagewise exposure and processing, and
 (3) an imaging medium capable of forming a cyan image upon imagewise exposure and processing,
each imaging medium having a maximum spectral sensitivity at a wavelength different from that of the maximum spectral sensitivity of the other imaging media and a sensitivity at the wavelength of maximum spectral sensitivity of any of said other imaging media which is not significant compared to the maximum sensitivity of said other media, exposing said element to three independently modulated sources each emitting radiation of a wavelength corresponding to the wavelength of maximum sensitivity of a respective imaging medium, said exposure being conducted in raster fashion.

It has been found that with a suitable selection of cyan, magenta and yellow image-forming layers of the type described above, it is possible to utilise a three-layer element to produce coloured half-tone images. In general, such elements will not be acceptable for colour proofing since there will be no separate black or balancing black layers and accordingly there will be no direct match with printing inks. However, the elements may be used to prepare high quality coloured half-tone images. The use of a half-tone imaging process has several advantages over a conventional continuous tone photographic reproduction, allowing more latitude in processing conditions whilst achieving consistency of reproduction to provide latitude for image formation.

The sensitometric contrast of each of the three imaging layers is preferably sufficiently high that the difference between the exposure required to give a density which is 5% of the maximum density above fog and the exposure required to give a density which is 90% of the maximum density above fog is less than 2.0 preferably less than 1.5 log exposure units. The sensitivities of the layers at the wavelength of maximum sensitivity preferably decrease from the layer of shortest wavelength sensitivity to the layer of longest wavelength sensitivity which sensitivity decreases to a value of less than 10% preferably 5% more preferably less than 2% i.e. more than 1.0, 1.3 and 1.7 logE units respectively. Generally, the minimum difference in sensitivity between any two layers is at least 0.2 log E units. The three-layer element may be utilised to generate a coloured half-tone dot image by exposure to three independently modulated sources. The black component of the desired image is obtained by combination of the yellow (Y), magenta (M) and cyan (C) in the same manner as in conventional colour photography.

For the three layer system it is preferred that the radiation sources emit at a wavelength at peak intensity in the range 550 nm to 900 nm and the wavelength separation between any two of the three different wavelengths is at least 20 nm.

One way of obtaining a dense black with a three layer (YMC) material (whilst still matching each of the densities of yellow, magenta and cyan to the printing inks is to coat each of the YMC imaging layers at a higher density. The dye densities would be chosen such that when all three are combined together the result is a dense black. To produce yellow, for example, the exposure of the magenta and cyan layers would be such so as to produce no magenta or cyan, but partial exposure of the yellow layer would be undertaken so as to produce an amount of yellow dye less than its maximum density but sufficient to exactly match the yellow printing ink. The yellow would be used therefore at two densities rather than one. Similar techniques would be used to produce magenta and cyan, or red, green and blue through appropriate combinations of yellow, cyan and magenta.

A disadvantage of this technique is that the resulting colours would be critically dependent on the precise value of the intermediate exposure and on processing variations. However, this problem may be obviated by utilizing two silver halide emulsions of different sensitivities within each colour forming layer.

It is also possible to utilize a four-layer (yellow, magenta, cyan and black or balancing black) positive acting element sensitised to only three different wavelengths to obtain high quality, half tone, full colour images suitable for use as a colour proofing system.

A radiation-sensitive element suitable for the preparation of half-tone colour proofs by exposure to three sources of different wavelength comprises a substrate bearing at least four positive acting imaging media coated thereon, said imaging media including:
(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing, and
(4) an imaging medium capable of forming a black image or balancing black image upon imagewise exposure and processing,
each imaging medium (1), (2) and (3) having a maximum spectral sensitivity at a wavelength different from that of the maximum sensitivity of the other imaging media of (1) to (3), the imaging medium (4) having spectral sensitivity at each of the wavelengths of the maximum sensitivity of the other imaging media.

The element has four colour-forming layers. A yellow layer (Y) sensitised to a first wavelength, a magenta layer (M) sensitised to a second wavelength, a cyan layer (C) sensitised to a third wavelength, and a black or balancing black layer (K) which is sensitised to all three wavelengths. All four layers are coated onto a base. The order of the layers may be Y, M, C then K, but other permutations are possible. In all cases, however, it is the black or balancing black layer which must be sensitised to all three wavelengths.

The material must be positive acting In other words, smaller amounts of colour-forming component, e.g. dye, are present after development in areas which are exposed to actinic radiation of the relevant wavelength, than is present in those areas not exposed. Also, the imaging process must be halftone. Thus, at any given point on the material, each colour-forming component is present at either maximum density or minimum density. For this reason, at any given point on the material the net colour can be colourless (e.g. white on a white reflecting base), yellow, magenta, cyan, blue, green, red or black with no intermediate shades. On a macroscopic scale, intermediate shades and colours are produced by the correct dot size of each of the Y, M, C and K.

There is a significant demand for colour hardcopy from electronically stored image data, output in a form which can be re-scanned. This arises from the demand for "second generation originals"; that is, original photographs which have been electronically retouched or otherwise modified and then copied onto fresh colour film to yield a clean 'original' which may be sent to other locations and subsequently scanned on a colour separation scanner. The Dr. Rudolf Hell Gmbh Colour Proof Recorder CPR403 which outputs continuous tone, colour hardcopy on standard colour paper or transparency is presently in commercial use for the production of such second generation originals.

It has been found that a colour proof recording system such as that disclosed in British Patent Application No. GB 2172118A can be modified to include the possibility of producing continuous tone second generation colour originals.

In this case the image produced should match, as closely as possible, the original which may be a colour transparency such as on Kodak Ektachrome or corresponding materials. Only a three colour material is therefore required (yellow, magenta and cyan). To produce continuous tone images the emission sources, e.g. LED arrays may be driven at any power level between the minimum and the maximum which would be used for halftone recording. Therefore in order to maximise reproducibility of tonal values, the exposure range of the individual sensitive layers of the material should match the practical intensity range of the emitting e.g. LED sources.

Continuous tone colour images may be obtained by a process which comprises providing a light sensitive photographic element comprising a substrate bearing three separate imaging media coated thereon, said imaging media comprising:
(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing,
each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelengths maximum spectral sensitivity being greater than 0.8 log exposure units, preferably greater than 1 log exposure unit, more preferably greater than 1.3 log exposure units,
    exposing said element to three independently modulated sources each emitting radiation of a wavelength in the region of the wavelength of maximum sensitivity of a respective imaging medium, the maximum emission intensities of the sources at the wavelength of their maximum output increasing from the source of shortest wavelength to longest wavelength by an amount corresponding to the sensitivity difference of the imaging media, said exposures being conducted in scanning, e.g. raster or vector fashion and over a number of discrete exposure, preferably discrete intensity levels.

It has now been found that the above described imaging processes which utilize false colour address to produce the colour images may be modified to produce images in the form of an intermediate transparency and the transparency may be used to image a variety of radiation sensitive photographic elements to produce a colour print or four-colour proof on true colour generating material, or panchromatic colour separations or colour separated printing plates. By so doing an information record of the colour separations is made in register during the scanning. This intermediate, which need not appear in true colour, contains individual absorbances which then may be used as exposure masks. The final images may be made on a contact exposing frame thus releasing the scanner from the task of making duplicate final copies.

SUMMARY OF THE INVENTION

Therefore according to the present invention there is provided an imaging process which comprises the steps of:

(i) providing a first radiation sensitive element comprising a transparent base having coated thereon at least three imaging media each capable of forming a colour image upon imagewise exposure and processing, each of said imaging media capable of forming a colour image having a maximum sensitivity at a wavelength different from the wavelengths of the maximum sensitivity of the other imaging media capable of forming a colour image and the wavelength of the maximum absorption of the colour image formed by each imaging medium differing from the wavelength of the maximum absorption of the colour image formed by the other imaging media by at least 40 nm;

(ii) obtaining colour separation information representative of the cyan, magenta and yellow and optionally black content of a colour original, or electronically generated image, (iii) exposing said first radiation sensitive element of step (i) to at least three independently modulated sources of radiation emitting in the region 550 to 900 nm, each source being modulated by said colour separation information with respect to one colour and emitting radiation at a wavelength in the region of the wavelength of maximum sensitivity of one of said imaging media capable of forming a colour image such that latent images representative of at least the cyan, magenta and yellow information of step (ii) are formed in individual colour forming media;

(iv) processing said exposed radiation sensitive element to produce a transparency comprising at least three colour images, a first colour image being representative of the colour separation information for cyan, a second colour image being representative of the colour separation information for magenta and a third colour image being representative of the colour separation information for yellow;

(v) exposing a second radiation sensitive element comprising a base having at least one imaging medium coated thereon through said transparency produced in step (iv) to record on said second radiation sensitive element an image corresponding to one or more of the images of said imaging media of the transparency.

The general teaching referred to above with respect to processes and materials utilizing false colour address is applicable to this invention with the exception that the images generated in the transparency of the invention are necessarily not true colour images.

By true colour representation is meant that the colours formed on viewing the final print correspond closely to the colours in the original artwork. False colour representation occurs when a colour is formed which is substantially different in hue from the colour in the original artwork.

Normally the first radiation sensitive element, termed the intermediate transparency or intermediate, will be exposed to three or four independently modulated sources each emitting radiation of a sensitivity of a respective medium. The source's emission generally corresponds to the maximum sensitivity of the photosensitive layer. This may include a precise correspondence of the wavelengths of emission and maximum sensitivity, or a slight mismatch.

The difference between the wavelength of maximum emission of the source and the wavelength of maximum sensitivity of the photosensitive layer will normally be less than 40 nm preferably less than 20 nm most preferably less than 10 nm. It will be appreciated that the source may be monochromatic e.g. as in laser exposure, or it may emit over a narrow band of wavelengths e.g. as in emitting diode exposure. Additionally the sensitising dyes may have relatively sharp or less so absorbances. Where a sensitising dye has a sharp absorbance the mismatch tolerance with the source will be reduced. Typically sensitising dyes used at 580 nm will have a sharper cut-off at longer wavelength than those used at 800 nm. In practice a corresponding source and sensitising dye will be chosen so that the source will cause significant exposure of one sensitised layer but not significant exposure of any other layers. Generally a source would be chosen to emit on or close to the wavelength of maximum spectral sensitivity of the layer with the sensitivity of the layer at the wavelength of maximum emission of the source dropping by not more than 0.4 logE, preferably not more than 0.1 logE, most preferably not more than 0.05 logE relative to the maximum spectral sensitivity possessed by the sensitised layer.

The image process of the invention generates an intermediate transparency which represents a hard copy record of the stored colour separation information of a colour original or colour computer-generated or computer modified composition, but does not necessarily visually constitute a true colour copy of the original. The intermediate transparency may be used to expose second elements which give for example (a) four colour (YMCK) printing proofs,
(b) true colour copies of the original,
(c) black and white colour separation images e.g. on panchromatic film, or
(d) printing plates.

The intermediate transparency allows the production of multiple copies of the original and/or the colour separations of the original by simple contact or projection exposure thereby obviating the requirement of repeated scanning which is time consuming and expensive. The use of a photographic material having four imaging media to form the transparency allows the recording of information representative of magenta, yellow, cyan and black or balancing black in the original and this transparency may be used with full colour generating photographic material capable of generating each colour to produce a colour proof by exposing using broad band radiation or four band wavelength corresponding to the sensitivity of each colour generating medium.

It will readily be appreciated that there is a wide range of options available within the process of the invention depending upon the choice of format of the final hard copy, the imaging chemistries and the exposure conditions employed. For example:

(a) In the intermediate

Exposure sources: these will be modulated so that a given source will be on or alternatively off when colour is represented;

The imaging chemistry will be chosen to be of the colour formation or colour removal type (the same type of layers will be used in any one element to allow common development);

the overall mode of reproduction of this element may be positive or negative.

the dye representing the orginal colour may be true i.e. similar to or exactly reproducing the original, or false i.e. absorbing in a substantially different spectral region:

(b) In the second element

Overall exposure may be undertaken on a contact frame using the resultant transparency from the first stage, which may bear positive or negative images;

the imaging chemistry may be chosen to be of the colour formation or colour removal type;

the overall reproduction of the second element may be in the positive or negative mode;

the dye or final image representing the original true colour may be true, or false. For example, in four colour proofs and three colour prints the final image will need to be a true colour representation of the original information.

In order to obtain, for example, a four colour proof after imaging of the first and second element it will be necessary to match the eXposure and image forming characteristics of the first element with that of the second to obtain the final true colour proof. That is the whole system must have a positive mode of reproduction.

In other circumstances, for example, where a black and white separation is made, the final reproduction may either be overall positive or negative relative to the original.

The first radiation sensitive material used to prepare the intermediate transparency may have various constructions depending upon the manner in which the original is analysed and the exposure technique to be employed and the final hard copy which is to be generated from the intermediate transparency.

According to one aspect of the invention the first radiation sensitive element which is suitable for production of the intermediate transparency comprises a transparent substrate bearing at least four separate imaging media coated thereon, said imaging media including:

(1) an imaging medium capable of forming a first colour image (CF1) upon imagewise exposure and processing, (2) an imaging medium capable of forming a second colour image (CF2) upon imagewise exposure and processing, (3) an imaging medium capable of forming a third colour image (CF3) upon imagewise exposure and processing, and (4) an imaging medium capable of forming a fourth colour image (CF4) upon imagewise exposure and processing, each imaging medium having a maximum spectral sensitivity at a wavelength generally within the range 400 to 900 nm, preferably 550 to 900 nm and different from that of the maximum sensitivity of the other imaging media preferably by at least 20 nm, more preferably at least 50 nm.

The imaging media of the elements are selected such that not only does each medium have a maximum spectral sensitivity at a wavelength which is different from the wavelengths of maximum spectral sensitivity of the other imaging media, but each imaging medium has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium.

These elements with four imaging media generate intermediates i.e. intermediate transparencies which are particularly suitable for the generation of highly accurate half-tone colour proofs. The element is exposed by the four independent sources of different wavelengths and image formation in each layer is attributable only to a single source. Thus each layer may be truly representative of a colour separation of the original and the printing plate used to apply the corresponding ink in the printing process.

The four colour images CF1 to CF4 which are formed in the first element have distinct spectral absorbances. The wavelength separation between maximum absorption wavelengths of the colours CF1 to CF4 must be at least 40 nm, preferably at least 50 nm. The particular colour of any image formed is not critical since the function of the intermediate transparency is to provide a series of masks through which the second photographic element is exposed. The dyes forming colour images CF1 to CF4 have absorbance peaks within the range 400 to 900 nm.

The second radiation sensitive element may be in the form of a colour proofing material which consists of four separate imaging media and each imaging medium is sensitive to a wavelength corresponding to the principal absorption of only one of the dyes (CF1 to CF4) formed in the intermediate transparency in the first element.

In particular circumstances it is possible to use the inherent unsensitised spectral sensitivity of a silver halide layer in the second element. Typically such inherent sensitivity lies in the ultra violet and blue end of the spectrum typically up to 450 or 500 nm. The unsensitised sensitivity changes according to the silver halide used and is reviewed in the "Theory of the Photographic Process" 3rd Edition Ed. TH James pg 39 (1977) MacMillan Publ. Co and Neblett "Handbook of Photography and Reprography" Ed J. M. Sturge Van Nostrand 1976 pg 73-74.

Exposure in a contact frame may be undertaken by using narrow bands of radiation, perhaps filtered, from a broad spectrum source emitting sufficiently widely to cover the range of sensitising dyes in the second element (i.e. the colour generation material) and is normally within the range of 400 to 900 nm.

Unsensitised layers in this invention must be placed so that they are the first layers exposed by the radiation i.e. they should be the layers closest to the source. The unsensitised layers may have positioned behind them and in front of the other layers a filter layer which will serve to absorb the actinic e.g. blue light used to expose the unsensitised layers. This then prevents the other layers from being exposed within their own bands of inherent spectral sensitivity. Sensitising dyes for the other layers are selected to absorb at different wavelengths from each other and from the band of inherent spectral sensitivity of the unsensitised layers.

The filter layer will be suitably transmitting at wavelengths corresponding to the sensitised layers' wavelengths of spectral sensitivity and will be selected to bleach or decolourise on processing.

For proofing in the second element true colour is generated after exposure and processing such that a yellow, a magenta, a cyan, and a black or balancing black will be present in the final image.

Thus, by using the intermediate and the colour generation material, a visually acceptable colour proof will be obtained. Repetition of the process allows production of multiple copies of the proof.

In addition to making the true colour proof the intermediate may be used for other purposes. The intermediate may be copied under contact conditions onto a panchromatically sensitised black and white emulsion where the panchromatic sensitivity range covers the range of the wavelengths of maximum absorbance of the colour images on the intermediate transparency. Exposure with only one filtered emission source (out of the four possible) leads to a black and white separation bearing colour information from the required channel. Other separations may be made by using the same panchromatic emulsion but with different sources or filtration of the emission.

Alternatively a variety of singly sensitised single layer black and white emulsions may be employed with each black and white emulsion being chosen to have a sensitivity corresponding to the appropriate colour image on the intermediate transparency.

Doubly or triply sensitised single layer black and white emulsions may also be used with appropriate filters to isolate each image of the intermediate transparency.

A further use for the intermediate is for the preparation of printing plates. A panchromatically sensitised plate or a variety of matching individually sensitised plates may be used. These may be exposed under contact conditions by using exposure light appropriate to the channel of information desired to be recorded. Thus the intermediate may be used for making four separate printing plates each bearing the appropriate colour separation information.

The advantages of using the intermediate for black and white colour separations and for the preparation of printing plates, include maintenance of dimensional stability improving registration, and that it is not necessary to have four or three separate separations at an earlier stage.

The separation in the second element may be enhanced by applying filters to the contact exposing source so as to match the emission to the maximum absorbances of the dyes CF1 to CF4 in the intermediate. Typically the contact exposure source should emit only in narrow bands of radiation to match the dyes (CF1 to CF4) but this must be balanced with exposure times and sensitivities of the layers.

For lithographic proofing the intermediates containing the four absorbing images are preferably used with second elements with four imaging media. It would however be possible to employ a secondary element which was only able to generate yellow, magenta and cyan information, omitting the use of the black information mask. Such a YMC element would be suitable for colour print purposes rather than lithographic proofing.

It will be appreciated that contact exposure using radiation which covers the four sensitising dyes will allow a single exposure to be made. However the colour generation material may be imaged by up to four separate sources. Additionally, the levels of sensitivity of the four media in the colour generation material may be different, generally with the medium whose maximum sensitivity is at its shortest wavelength being more sensitive, for example, three times more sensitive than that of longest wavelength.

For the purposes of making a printing proof the first and second elements have four separately sensitised layers. Any combination of colour bleaching or colour formation chemistries may be employed where the resultant colours are represented by sharply absorbing dyes, for example, respectively positive and positive, positive and negative, negative and positive or, negative and negative. The final proof is a true reading positive colour reproduction if that is required.

The exposure of the first photographic element may be in the form of a half tone dot pattern and thus the exposure of the second element will also take this form. The various image forming media will have a high contrast preferably such that the difference between the exposure required to give a density of no more than about 5% of the maximum density above fog and the exposure required to give a density which is at least about 90% of the maximum density above fog is less than 2.0 preferably less than 1.5 log exposure units.

The sensitivities of the layers at the wavelength of maximum sensitivity preferably decrease from the layer of shortest wavelength sensitivity to the layer of longest wavelength sensitivity which sensitivity decreases by more than 1.0 logE preferably by more than 1.3 logE, more preferably by more than 1.7 logE relative to the sensitivity of the layer of shortest wavelength sensitivity. Generally, the minimum difference in sensitivity between any two layers is at least 0.2 log E units.

The absorption profiles of the dyes forming the colour images CF1 to CF4 within the intermediate transparency described above are distinct from each other. However it is possible to utilize one of CF1 to CF4 having a broad absorption profile having an absorption at each wavelength essentially equal to that of the other CF's. It is essential that the broad colour image CF is imaged in accordance with the separation information for black.

The exposure of the intermediate transparency is identical to that described above. However, on contact exposing the second photographic element having a four layer construction through the intermediate transparency, since the broad CF absorbs at the wavelengths of the other three CF's whenever black dots are required on the second element all of the layers in that element will remain unexposed. Thus it is sensible to use a balance black in the second element, the function of which is to add to the absorption provided by the yellow, magenta and cyan.

The use of the balance black reduces the dye loading and silver coating weight in the proof and hence should give better minimum optical density, Dmin.

When exposing a balance black type material proof material directly on the scanner the registration of the four light sources e.g. LED arrays must be very precise to avoid colour fringing around each (black) dot. Furthermore, extra electronic circuitry is needed to ensure that each of the YMC layers are not exposed wherever there is a black dot. In the case where a broadly absorbing dye is used in the intermediate and a balancing black in the final copy, registration will not be critical and extra circuitry will not be needed.

When a first element with a broadly absorbing dye employed to represent the black information is to be contacted to a second element having a four layer construction, then only combinations of positive and positive, and negative and negative may be employed.

It is possible to use a four imaging media radiation sensitive element for preparation of the transparency which is sensitive to only three different wavelengths. Such an element which is imaged by exposure to three sources of different wavelength comprises a substrate bearing at least four imaging media (which may be positive or negative acting) coated thereon, said imaging media including:

(1) an imaging medium capable of forming a first colour image (CF1) upon imagewise exposure and processing,
(2) an imaging medium capable of forming a second colour image (CF2) upon imagewise exposure and processing,
(3) an imaging medium capable of forming a third colour image (CF3) upon imagewise exposure and processing, and
(4) an imaging medium capable of forming a fourth colour image (CF4) upon imagewise exposure and processing, each imaging medium (1), (2) and (3) having a maximum spectral sensitivity at a wavelength different from that of the maximum sensitivity of the other imaging media of (1) to (3), the imaging medium (4) having spectral sensitivity at each of the wavelengths of the maximum sensitivity of the other imaging media.

The element has four colour-forming layers. The CF1 layer (which may be representative of yellow) sensitised to a first wavelength, the CF2 layer (which may be representative of magenta) sensitised to a second wavelength, the CF3 layer (which may be representative of cyan) sensitised to a third wavelength, and the CF4 layer which is representative of the black component and which must be sensitised to all three wavelengths. All four media, preferably as individual layers are coated onto a transparent base. The order of the layers may be CF1, CF2, CF3 then CF4, but other permutations are possible. In all cases, however, it is the CF4 layer representative of black which must be sensitised to all three wavelengths.

When the material is positive acting, a smaller amount of colour-forming component, e.g. dye, is present in areas which are exposed by light of the relevant wavelength, than is present in those areas not exposed. The imaging process must be halftone. Thus, at any given point on the material, each colour-forming component is present in the final image at either maximum density or minimum density.

The transparency obtained from the four imaging media exposed to three wavelengths may be utilized to expose a second photographic element in the manner described above to produce true colour images. When the first element is so constructed to require only three separate wavelengths for exposure, only combinations of positive and positive, or negative and negative may be employed.

In accordance with a further aspect of the invention the transparency of a four imaging media construction sensitised to four wavelengths includes a colour former for CF4 having a broad absorption profile in the image forming medium representative of black or balancing black which is used to image a second photographic element having a four layer construction sensitised to three different wavelengths. The absorption profile of CF4 will encompass the absorption peaks of CF1 to CF3 but need not extend significantly beyond the peaks. The transparency is exposed to four different wavelengths as described above.

The contact exposure of the second element through the transparency will be performed at just three wavelengths. Black in the proof will be sensitised to each of the wavelengths whilst Y,M and C will be sensitised to just one of the wavelengths. Wherever black dots are required, none of the YMC or K in the proof will be exposed. Wherever any one of YMC are exposed and bleached, so will the black.

This technique has the additional advantage that colour speararation during contact exposure of the subsequent proof will be improved. The disadvantage is that a three colour (YMC) black cannot be obtained.

Using a four layer first element having one broadly absorbing dye to represent the black information and with a proofing medium which requires three separate sources but generates four colour, (YMCK), then combinations of positive to positive, or negative to positive acting elements are allowed.

In addition to the half tone materials described above, the invention may employ continuous tone materials to generate the intermediate transparency. For example the first radiation sensitive element may comprise a transparent substrate bearing three separate imaging media coated thereon, said imaging media comprising:

(1) an imaging medium capable of forming a first colour image (CF1) upon imagewise exposure and processing,
(2) an imaging medium capable of forming a second colour image (CF2) upon imagewise exposure and processing,
(3) an imaging medium capable of forming a third colour image (CF3) upon imagewise exposure and processing, each imaging medium having a maximum spectral sensitivity at a wavelength different from that of the maximum spectral sensitivity of the other imaging media within the range 550 to 900 nm, the sensitivities at the wavelengths of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelengths maximum spectral sensitivities being greater than 0.8 preferably greater than 1 log exposure unit, more preferably greater than 1.3 log exposure units.

This element may be exposed to three independently modulated sources, each emitting radiation of a wavelength corresponding to the wavelength of maximum sensitivity of a respective imaging medium, the maximum emission intensities of the sources at the wavelength of their maximum output increasing from the source of shortest wavelength to the source of longest wavelength by an amount corresponding to the sensitivity difference of the imaging media, said exposures being conducted in raster fashion and over a number of discrete exposure levels. After processing a continuous tone transparency is obtained which may be used to generate true colour images as described above.

The individual emissions of the exposing devices used to expose the intermediate transparency the invention are preferably selected from the range 550 to 900 nm. Whilst the individual emission could be selected from within a much broader wavelength band there are certain advantages in selecting emissions within the range 550 to 900 nm. Firstly, this region allows safelight handling of the elements in blue or green light. If required the element may additionally be provided with a bleachable yellow filter to improve safelighting properties. A further reason for the choice of green, yellow, red and infrared emitting sources is the ready availability of relatively high powered semiconductor devices in this region. Suitable, commercially available exposing sources include:

- 555 nm a green emitting (LED), part No. ESAY 3431 available from Stanley Electric Co.
- 580 nm a yellow emitting (LED), part No. ESB 63401 available from Stanley Electric Co.
- 660nm a light emitting diode (LED), part No. H2K commercially available from Stanley Electric Company, Semiconductor Division, Japan
- 735nm an emitting diode, part No. HLP40RA, commercially available from Hitachi Electronic Components (UK) Limited, 221-225 Station Road, Harrow, Middlesex
- 780 nm an infrared emitting diode (IRED), part No. HLP60RB, commercially available from Hitachi Electronic Components (UK) Limited, and a laser diode, part No. LT-024MD, commercially available from Sharp Corporation, Osaka, Japan
- 830 nm an infrared emitting diode (IRED), part No. HLP60RC, commercially available from Hitachi Electronic Components (UK) Limited, and a laser diode, part No. LT-015MD, commercially available from Sharp Corporation, Osaka, Japan Generally the image-forming layers represented in both the first and second elements used in the invention are silver halide emulsions which may be of the silver dye-bleach type or in which the dye images are formed by a colour coupler process or a dye diffusion transfer process. For halftone recording silver dye-bleach systems are preferred because of high resolution and inherent high contrast of such systems. An additional advantage is that the density and hue of the various layers may be controlled during film manufacture.

Silver dye-bleach, dye diffusion transfer and colour coupler imaging systems are well known and are disclosed, for example, in "The Theory of the Photographic Process", 4th Edition, Mees & James, Macmillan Publishing Co. Inc., pages 353 to 372, "Dye Diffusion Systems in Colour Photography", Van de Sande, Angew. Chem. Int. Ed. Engl. 22 (1983), pages 191 to 209, and "Imaging Systems", Jacobson & Jacobson, Focal Press, 1976 pages 86 to 103.

Image forming layers of the dye diffusion transfer type rely on the imagewise diffusion of preformed dyes from the imaging layer to a mordant containing receptor layer. The final coloured image is formed in the receptor layer which may subsequently be separated from the imaging layer. A comprehensive review of chemical mechanisms by which imagewise dye diffusion may be achieved is given, for example, in "Dye Diffusion Systems in Colour Photography" Angewandte Chemie International Edition 1983, 22, 191-209. The preferred types of dye diffusion transfer for the practice of this invention are:

(1) The system employing 'dye developers' which are dye molecules linked to one or more hydroquinone developing moiety. This is described in detail in "The Chemistry of Synthetic Dyes", K. Venkataraman, Vol. VIII, chapter 8, New York, Academic Press, 1978.

(2) The system employing "Redox dye release" molecules such as those of the ortho- or parasulphonamidophenol or sulphonamidonaphthol types described, for example, in "The Theory of the Photographic Process", T. H. James, 4th Edition, page 370 New York, Macmillan, 1977.

(3) The system employing sulphonomethylene derivatives of quinones as described in European Patent Application No. 4,399.

Image forming layers of the colour coupler type rely on the colour forming reaction between a 'colour coupler' which is usually incorporated in the imaging layer and oxidised colour developing agent. A review of materials which may be used in constructions of this type is given in "Research Disclosure" Vol. 187 item 18716, 1979.

In addition to the photosensitive image-forming media described above it is also possible to employ colour photothermographic media of the dry silver type, such as disclosed in United States Patent Specification No. 4460681. Silver halide photothermographic imaging materials essentially comprise a light sensitive, reducible silver source, a light insensitive material which generates silver when irradiated and a reducing agent for the silver source. The light sensitive material is generally photographic silver halide which must be in catalytic proximity to the light insensitive silver source. The silver sources used in this area of technology are materials which contain silver ions, the earliest and still preferred source comprising silver salts of long chain, carboxylic acids usually of from 10 to 30 carbon atoms, the silver salt of behenic acid or mixtures of acids of light molecular weight have been primarily used. It is possible to prepare multi-colour, photothermographic imaging articles by providing various colour forming layers maintained distinct from each other on generally a film base.

The light sensitive layers of the first radiation sensitive element may be coated on any suitable base which is transparent to the radiation used for exposing the second element. The construction preferably incorporates an antihalation backing. The antihalation layer may contain bleachable dyes or black colloidal silver may be used, or a strippable layer of pigment e.g. carbon black, and mixtures of dyes may be used. Suitable bases include any polymeric material and especially biaxially oriented polyester film.

The second radiation sensitive element may have an opaque or a transparent base depending upon the form of the element. Elements for generation of full colour prints or proofs will normally comprise an opaque base such as a white pigmented or vesicular polyester film which may have an antihalation underlayer. Additionally photographic grade base paper may be employed. The imaging layers are selected to generate the true colour content of the original and are sensitised to the wavelength of the light transmitted through the transparency which is representative of that colour.

A wide variety of sensitising dyes may be used to sensitise the individual photosensitive layers to the relevant portion of the spectrum, preferably to green, yellow, red and near infrared light; these have been well documented in the literature.

Spectral sensitisation of silver halide by dyes produces a sensitivity peak which usually falls off much more sharply to the long wavelength side than it does to shorter wavelength. Increased colour separation can therefore be achieved if the sensitivities of the layers (at the wavelength of maximum spectral sensitivity) decrease from the layer of shortest wavelength sensitivity to the layer of longest wavelength sensitivity. Preferably the sensitivity decreases by more than 1.3 logE preferably more than 1.7 logE. Generally, the minimum difference in sensitivity between any two layers is at least 0.2 log E units.

To test the viability of producing a intermediate material to be imaged on the scanner and subsequently contact-printed on the second (proofing) element, a computer simulation of the copying was carried out. This employed an intermediate transparency incorporating four imaging media, sensitive to four separate wavelengths.

For material exposed directly on the scanner such as from GB No. 2172118A, both the set of maximum sensitivities (e.g. at 580, 660, 730, 800 nm) and the particular set of dyes to match the printing inks must be incorporated in the same material. In the case of the present invention, i.e. the multiple proofing system, the maximum sensitivities as dictated by the scanner are retained by the intermediate transparency but the dyes that simulate the printing inks are in a separate second element, the final proof. Therefore, the choice of dye colours in the intermediate transparency and the choice of wavelengths of maximum sensitivity in the second, copy material are to some extent arbitrary, the constraint being the necessity to preserve the information relating to each of the colour separations during the procedure.

It is assumed that the second proofing element consists of slow, fine-grain, high contrast emulsions, exposed to a filtered white-light source. FIG. 1 illustrates the variation of sensitivity with wavelength for the four layers of a proposed copy material. In each case a maximum value of 100 is assigned. The sensitivity of layer 1 is assumed to be typical of silver-bromide emulsion. Those of the other layers are derived from wedge spectrograms made on actual coated materials. It is anticipated that each of the lower layers will have inherent blue sensitivity which is suppressed by a yellow filter as shown in FIG. 2.

Calculations indicate that if the filter layer is omitted the dye densities in the intermediate transparency are substantially increased.

Figure 2:
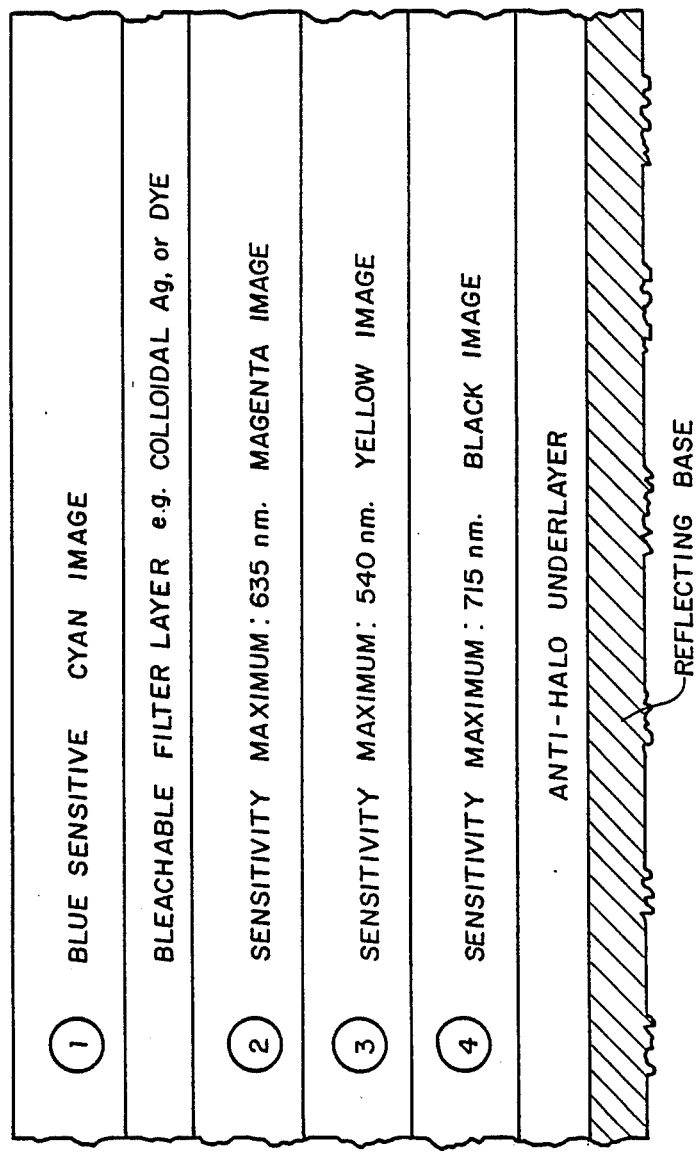

In FIG. 2, a suggested layer order for the copy material is given, identifying the maximum sensitivites and the colours of the image dyes. There is considerable choice in the layer order except for the neccessity for the blue sensitive layer to be as shown when a filter layer is used. The particular pairing of maximum sensitivities and the dye colours has been chosen so that the absorption of each dye is fairly low at the maximum sensitivity of the layers. This minimises the decrease in apparent contrast due to the absorption of the exposing light in the layer.

The layer order of the intermediate is not significant for the copying process and is not specified for most of the following discussion. To facilitate the explanation it is assumed that the second material is positive acting.

The essential problem in choosing the dye colours of the intermediate is as follows To preserve the colour separations originally created in the scanner, the presence or absence of each dye in the intermediate must affect only one layer of the material. For example if only a yellow dot is required in the second material, the other three dyes must be bleached. One image in the intermediate must be at sufficient density to prevent bleaching of the yellow dye in the second element. The dye densities of the intermediate transparency at other wavelengths must be sufficiently low to permit bleaching of the other three dyes in the second material. On the other hand, if in the second material only the yellow is required to be bleached, the dye in the intermediate responsible for the yellow layer in the second material must be absent, with the other three dyes still present. These three dyes will, in general, have secondary absorptions that give some density at the peak absorption of the dye responsible for the yellow copy dye. Therefore to preserve intact the information just given as example i.e. the presence of only yellow, or the absence of only yellow, the primary density of the yellow information bearing dye in the intermediate must be substantially more than the sum of the secondary absorptions of the other three intermediate dyes. In this context "substantially" more means an amount at least equal to the logE range of the appropriate sensitive layer of the copy material A range as low a 0.5 logE may be possible, but the results given below are calculated on a range of 0.75 logE. The same consideration applies to the other three dyes of the intermediate. In each case the peak absorption of the dye (strictly speaking: the absorption integrated over the region of maximum sensitivity of the appropriate layer of the copy) must be in excess of the secondary absorption of the other three dyes. The computational problem then resolves into finding the peak dye densities that satisfy the required conditions.

The conditions are satisfied when the difference in sensitivity of each layer in the copy material increases by 0.75 logE when the appropriate single dye of the intermediate transparency is replaced by the other three dyes of the intermediate transparency. Thus eight separate configurations of dyes in the intermediate transparency must be examined. For each of these the apparent sensitivites of the four layers of the copy must be calculated by integrating the spectral sensitivity curves with the light source "filtered" by the dyes of the intermediate transparency.

Other conditions must be stipulated for the calculations. The exposing source was chosen to consist of four narrow bands, created for example by interference filters, with absorption bands 20 nm wide at half-peak, and centered at 450, 540, 635 and 715 nm. No assumption need be made about the absolute sensitivites of the copy material; they can be brought to the required relative levels by adjustment of silver halide grain sizes. Additionally, the relative exposures in the four spectral regions of the source can be altered, either by sequential timed exposures, of by varying the relative areas of filters covering a large area source.

Figure 3:
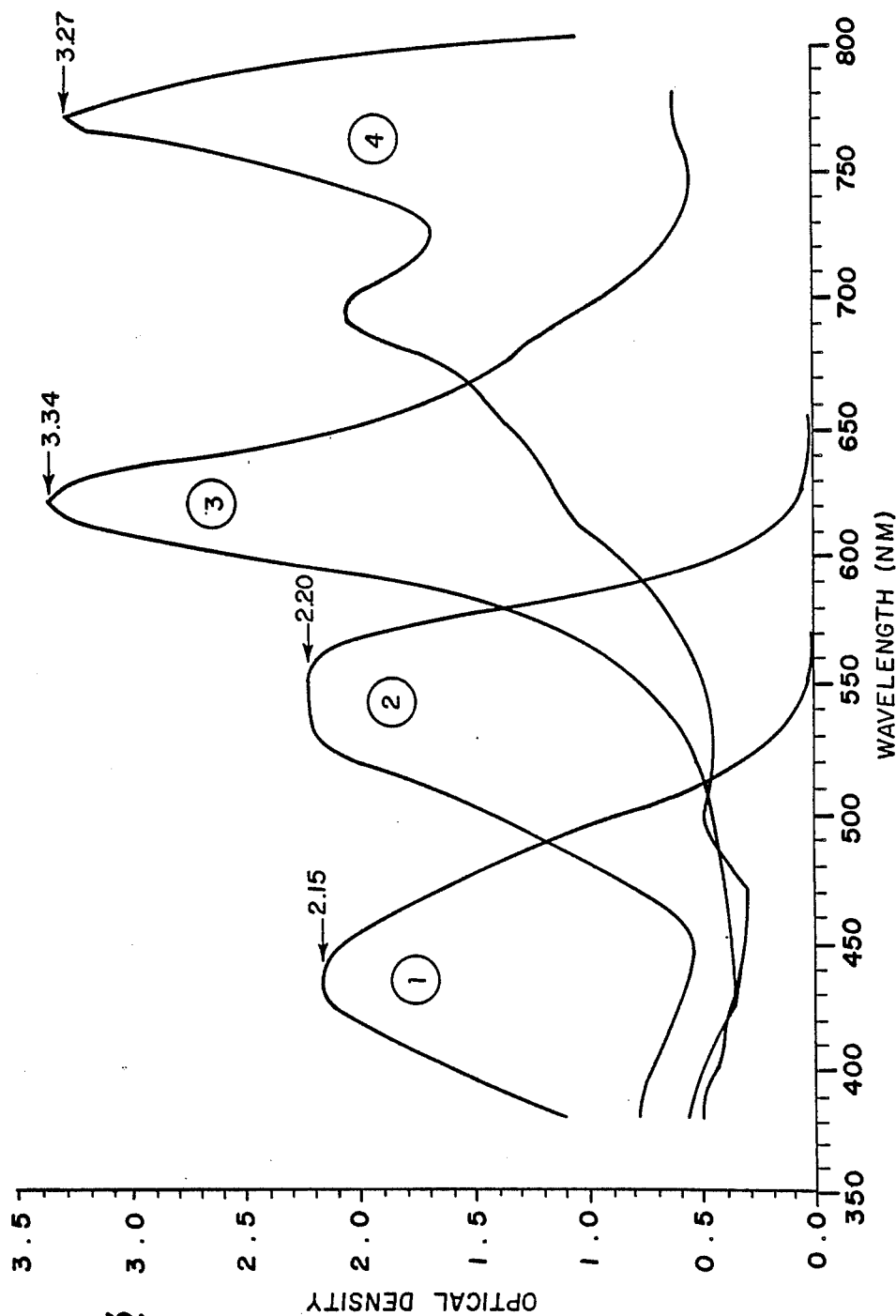

FIG. 3 gives the absorption curves for four azo dyes (Dyes 1 to 4) evaluated sectrophotometrically, scaled to the quantities necessary to produce a 0.75 logE differential to the layers of the copy material. The peak densities are indicated.

The structions of Dyes 1 to 4 are as follows:

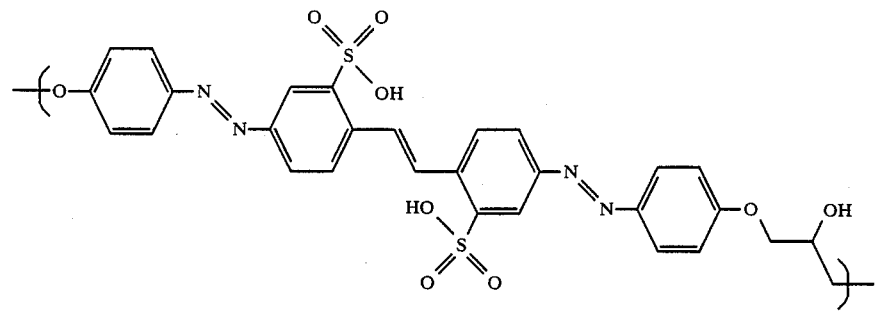

Azo Dye 1

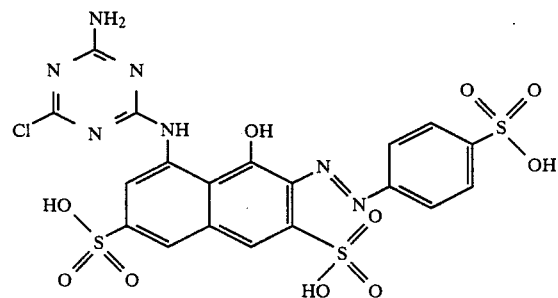

Azo Dye 2

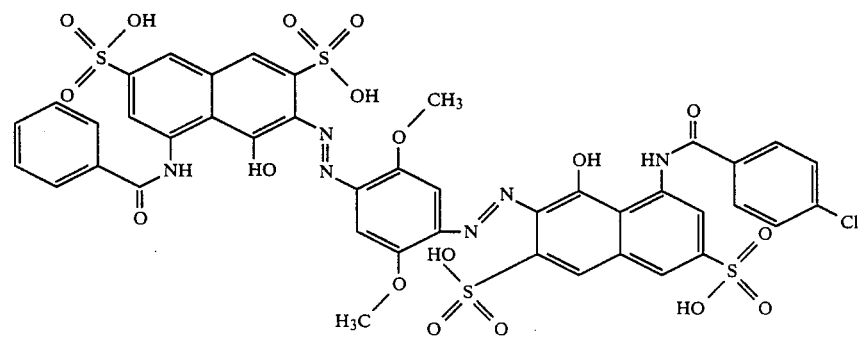

Azo Dye 3

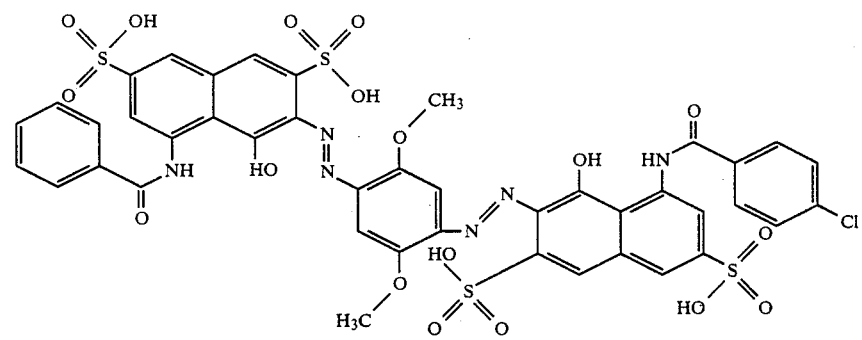

Azo Dye 4

The secondary absorptions of the dyes of the intermediate tranparency in the example are fairly high, leading to high peak densities to create the required differential exposures to the copy material. Inspection of the curves will readily lead to the conclusion that sufficiently high secondary absorptions in several dyes can render impossible the satisfaction of the conditions described previously.

High secondary absorptions are usually associated with the dyes (particularly the azo dyes that could be used in the intermediate transparency), that have peak aborptions in the red and near infra-red regions. The exacting demand for four dyes with low secondary absorptions can be alleviated by assuming that when black dots are present in the final copy the other three dyes can also be present. The dye in the intermediate tranparency responsible for the black image of the copy can then be permitted to absorb substantially in other regions. In fact if the black information-bearing layer of the intermediate tranparency is deliberately arranged to absorb at all wavelengths of maximum sensitivity of the copy material, the black image of the copy can be reduced in density to that of a balancing black. The constraints on the other three dyes of the intermediate transparency are thus reduced and only six configurations of dyes need be examined critically.

Figure 4:
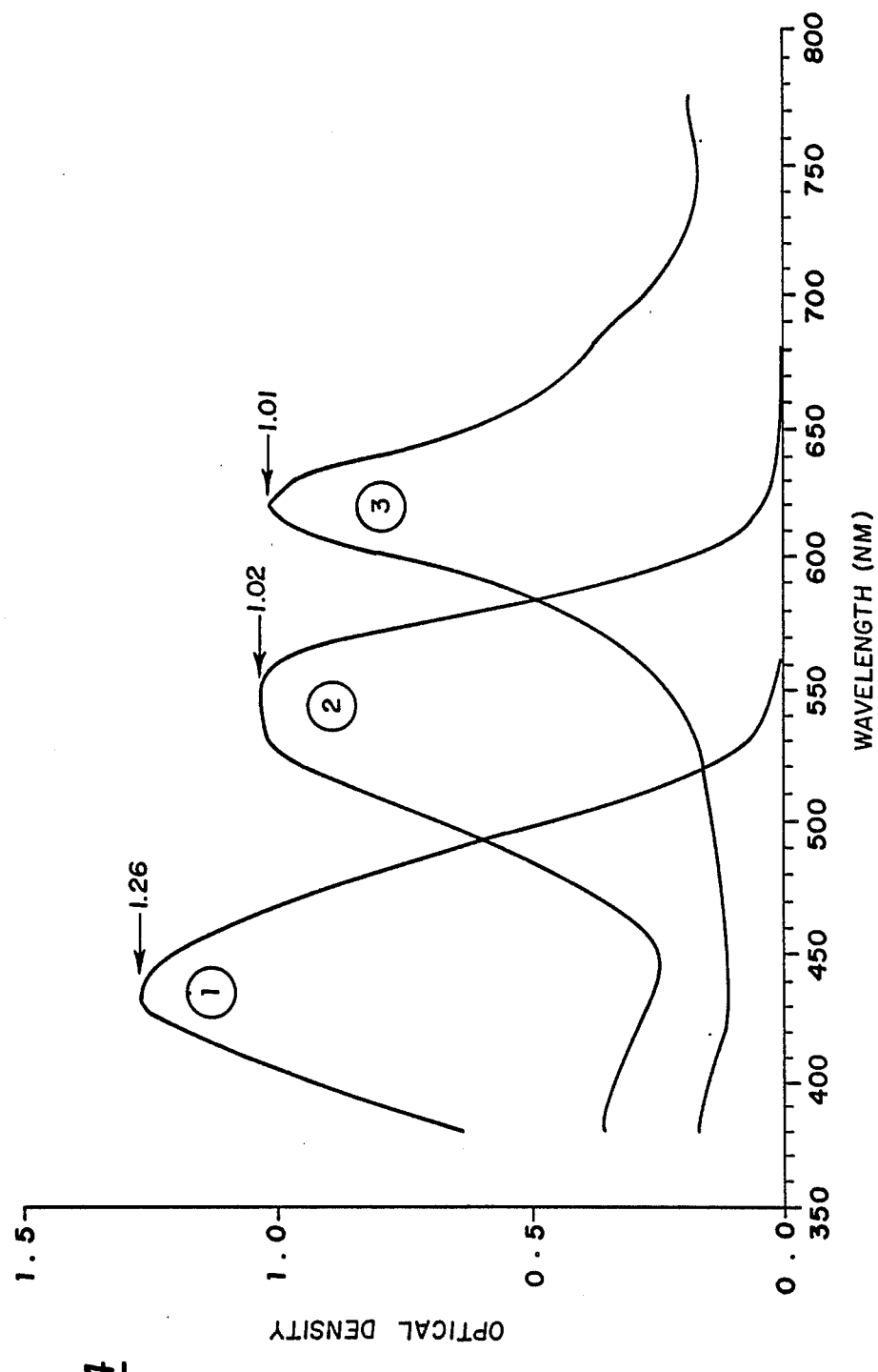

FIG. 4 shows the results of the calculation for which the densities of only three dyes in the intermediate transparency were critical Not only are the indicated peak densities lower than those shown in FIG. 3, the emission bands of the source were extended from 20 to 30 nm. The fourth dye, not shown is responsible for the black image of the copy material. It is necessary for the optical density of this dye in the region of 715 nm to be substantially higher than the secondary absorptions of the other dyes in this region. The density of this fourth dye at other regions can if required be raised to the same level by the addition of other dyes, if the black layer of the copy material is designed to be a balancing black.

Figure 5:
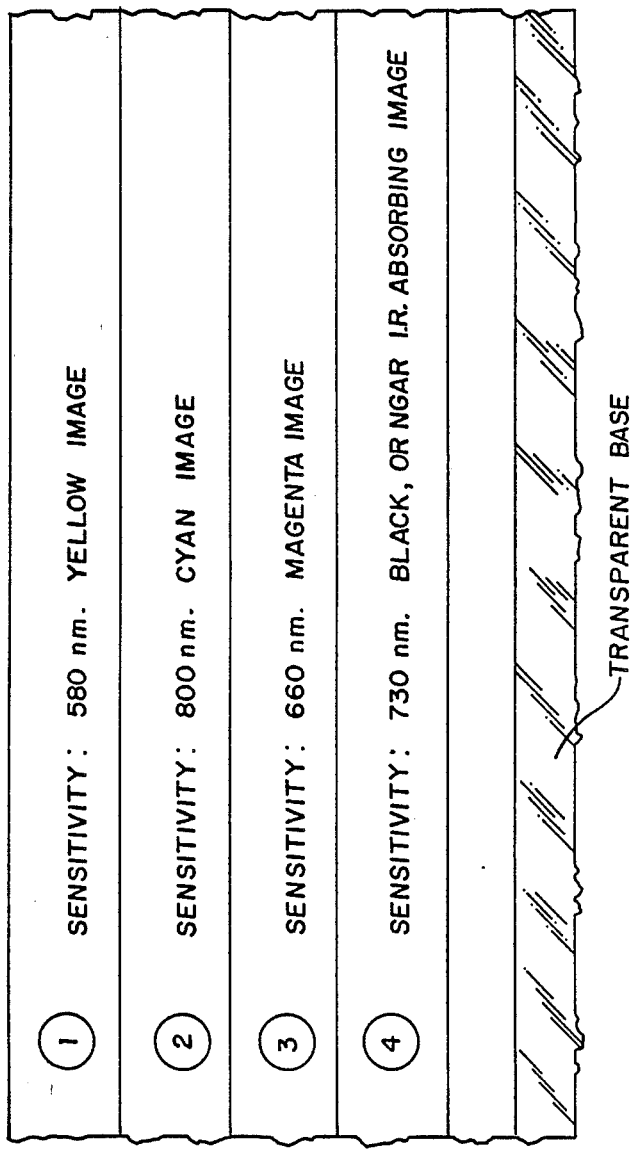

Apart from the colour of the dyes, the characteristics of the intermediate material will be similar, particularly in regard to relative emulsion speeds, to the single-copy proof material described in British Patent Application GB No. 2172118A. Because the quantities of dyes are higher than the single-copy material minor adjustments of emulsion speeds may be required. Furthermore, the optimum layer order and distribution of dye colours with sensitivity maxima may be different, but the principles of operation, in particular the wavelength range utilised, and the interdependence of emulsion speed and emitting diode emission are the same. FIG. 5 shows a possible configuration for the intermediate material. In this example the dyes are distributed in the layers in such a way that they do not absorb at the wavelengths of maximum sensitivity.

References to FIGS. 2 and 5 will show that the yellow image in the final copy is originally generated by the source emitting at 660 nm and producing a magenta image in the intermediate material. Similarly the final magenta image is generated from the 800 nm emitting source via an intermediate cyan image, the final cyan image is generated from the 580 nm emitting source via a yellow intermediate image, and the final black (or balancing black) image is generated from the 730 nm emitting source via a near infra-red absorbing (or black) intermediate image.

The imaging media used in the intermediate contain photosensitive siver halide. The imaging media in the second radiation sensitive element may contain photosensitive silver halide or alternatively non-silver halide containing imaging media may be used.

We claim:

1. An imaging process which comprises the steps of:
   (1) providing a first radiation sensitive element comprising a transparent base having coated thereon only three imaging media, each of said three media being capable of forming a colour image upon imagewise exposure and processing, each of said imaging media being capable of forming a colour image and having a maximum sensitivity at a wavelength different from the wavelengths of the maximum sensitivity of the other imaging media being capable of forming a colour image and the wavelength of the maximum absorption of the colour image formed by each imaging medium differing from the wavelength of the maximum absorption of the colour image formed by the other imaging media by at least 40 nm;
   (ii) obtaining colour separation information representative of the cyan, magenta, and yellow content of a colour original or electronically generated image,
   (iii) exposing said first radiation sensitive element of step (i) to three independently modulated sources of radiation from 550 to 900 nm, each source being modulated by said colour separation information with respect to one colour and emitting radiation at a wavelength in the region of the wavelength of maximum sensitivity of one of said imaging media capable of forming a colour image such that a latent image representative of at least the cyan, magenta, and yellow information of step (ii) is formed in individual colour forming media;
   (iv) processing said exposed radiation sensitive element to produce a transparency comprising three colour images, a first colour image being representative of the colour separation information for cyan, a second colour image being representative of the colour separation information for magenta, and a third colour image being representative of the colour separation information for yellow,
   (v) exposing a second radiation sensitive element comprising a base having at least one imaging medium coated thereon through said transparency produced in step (iv) to record on said second radiation sensitive element an image corresponding to one or more of the images of said imaging media of the transparency,
   wherein each imaging medium of said three imaging media within said first element has a sensitivity at the wavelengths of maximum spectral sensitivity of the other imaging media which is not significant with respect to said sensitivity at the wavelength corresponding to the maximum spectral sensitivity of said other imaging media, and wherein exposing of said first radiation sensitive element comprises a false color address of a medium, and wherein said first radiation sensitive element comprises a transparent substrate bearing three separate imaging media coated thereon, said imaging media including:
   (1) an imaging medium capable of forming a first colour image upon imagewise exposure and processing,
   (2) an imaging medium capable of forming a second colour image upon imagewise exposure and processing, and
   (3) an imaging medium capable of forming a third colour image upon imagewise exposure and processing,
   each imaging medium having a maximum spectral sensitivity at a wavelength within the range 400 to 900 nm and different from that of the maximum sensitivity of the other imaging media by at least 20 nm, the exposure of step (iii) being conducted in half-tone.

2. A process as claimed in claim 1 in which each imaging medium within one element has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium.

3. A process as claimed in claim 1 in which the wavelength separation between maximum absorption wavelengths of any two coloured images of the transparency is at least 50 nm.

4. A process as claimed in claim 2 in which the wavelength separation between maximum absorption wavelengths of any two coloured images of the transparency is at least 50 nm.

5. A process as claimed in claim 1 in which the second radiation sensitive element comprises a full colour generating element and is exposed through the transparency to radiation of wavelengths corresponding to the wavelengths of maximum sensitivity of its photosensitive media.

6. A process as claimed in claim 2 in which the second radiation sensitive element comprises a full colour generating element and is exposed through the transparency to radiation of wavelengths corresponding to the wavelengths of maximum sensitivity of its photosensitive media.

7. A process as claimed in claim 3 in which the second radiation sensitive element comprises a full colour generating element and is exposed through the transparency to radiation of wavelengths corresponding to the wavelengths of maximum sensitivity of its photosensitive media.

8. A process as claimed in claim 2 in which the second radiation sensitive element comprises a panchromatic element or photosensitive printing plate.

9. An imaging process which comprises the steps of:
(1) providing a first radiation sensitive element comprising a transparent base having coated thereon only three color forming imaging media each being capable of forming a colour image upon imagewise exposure and processing, each of said imaging media being capable of forming a colour image and having a maximum sensitivity at a wavelength different from the wavelengths of the maximum sensitivity of the other imaging media being capable of forming a colour image and the wavelength of the maximum absorption of the colour image formed by each imaging medium differing from the wavelength of the maximum absorption of the colour image formed by the other imaging media by at least 40 nm;
(ii) obtaining colour separation information representative of the cyan, magenta, and yellow content of a colour original or electronically generated image,
(iii) exposing said first radiation sensitive element of step (i) to three independently modulated sources of radiation from 550 to 900 nm, each source being modulated by said colour separation information with respect to one colour and emitting radiation at a wavelength in the region of the wavelength of maximum sensitivity of one of said imaging media capable of forming a colour image such that a latent image representative of at least the cyan, magenta, and yellow information of step (ii) is formed in individual colour forming media;
(iv) processing said exposed radiation sensitive element to produce a transparency comprising only three colour images, a first colour image being representative of the colour separation information for cyan, a second colour image being representative of the colour separation information for magenta, and a third colour image being representative of the colour separation information for yellow,
(v) exposing a second radiation sensitive element comprising a base having at least one imaging medium coated thereon through said transparency produced in step (iv) to record on said second radiation sensitive element an image corresponding to one or more of the images of said imaging media of the transparency,
wherein each imaging medium of said three imaging media within said first element has a sensitivity at the wavelengths of maximum spectral sensitivity of the other imaging media which is not significant with respect to said sensitivity at the wavelengths corresponding to the maximum spectral sensitivity of said other imaging media, and wherein exposing of said first radiation sensitive element comprises a false color address of a medium, and in which the second radiation sensitive element comprises a panchromatic element or photosensitive printing plate.

10. A process as claimed in claim 9 in which the wavelength separation between maximum absorption wavelengths of any two coloured images of the transparency is at least 50 nm.

11. A process as claimed in claim 9 in which the second radiation sensitive element comprises a full colour generating element and is exposed through the transparency to radiation of wavelengths corresponding to the wavelengths of maximum sensitivity of its photosensitive media.

* * * * *

UNITED STATES PATENT AND TRADEMARK OFFICE
CERTIFICATE OF CORRECTION

PATENT NO. : 4,943,517
DATED : July 24, 1990
INVENTOR(S) : Powers, Finn and Fisher It is certified that error appears in the above-identified patent and that said Letters Patent is hereby corrected as shown below:

Column 8, line 15, "radiation of a sensitivity of a respective medium" should be --radiation of a wavelength corresponding to the wavelength of maximum sensitivity of a respective medium--.

Column 19, line 58, "$H_3C-O$" should be --$H_3C-CH_3$--.

Signed and Sealed this

Twenty-fourth Day of September, 1991

Attest:

HARRY F. MANBECK, JR.

*Attesting Officer*    *Commissioner of Patents and Trademarks*